(12) United States Patent
Ko et al.

(10) Patent No.: US 7,470,636 B2
(45) Date of Patent: Dec. 30, 2008

(54) SEMICONDUCTOR INTERLAYER DIELECTRIC MATERIAL AND A SEMICONDUCTOR DEVICE USING THE SAME

(75) Inventors: Min-Jin Ko, Seoul (KR); Hye-Yeong Nam, Cheongju (KR); Jung-Won Kang, Seoul (KR); Myung-Sun Moon, Daejeon (KR); Dong-Seok Shin, Seoul (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 11/639,318

(22) Filed: Dec. 15, 2006

(65) Prior Publication Data

US 2007/0173074 A1 Jul. 26, 2007

Related U.S. Application Data

(63) Continuation of application No. 10/652,918, filed on Aug. 28, 2003, now abandoned, which is a continuation-in-part of application No. 09/776,383, filed on Feb. 2, 2001, now Pat. No. 6,696,538.

(60) Provisional application No. 60/179,653, filed on Feb. 2, 2000.

(51) Int. Cl.
*H01L 21/469* (2006.01)
*C08G 77/04* (2006.01)

(52) U.S. Cl. .......................... 438/790; 528/33; 528/34; 528/37

(58) Field of Classification Search ................. 438/790; 528/37
See application file for complete search history.

(56) References Cited

U.S. PATENT DOCUMENTS

| | | | | |
|---|---|---|---|---|
| 2,681,355 A * | 6/1954 | Gilkey et al. ................. 556/466 |
| 2,721,855 A * | 10/1955 | Kin ............................. 528/25 |
| 4,689,085 A * | 8/1987 | Plueddemann ......... 106/287.14 |
| 4,798,629 A * | 1/1989 | Wood et al. ............ 106/287.16 |
| 5,073,456 A | 12/1991 | Palladino |
| 5,186,745 A * | 2/1993 | Maniar ................... 106/287.16 |
| 5,218,059 A | 6/1993 | Kishihara et al. |
| 5,316,855 A | 5/1994 | Wang et al. |
| RE34,675 E * | 7/1994 | Plueddemann ............ 106/287.1 |
| 5,359,112 A * | 10/1994 | Drake ......................... 556/479 |
| 5,548,051 A * | 8/1996 | Michalczyk et al. .......... 528/15 |
| 5,817,582 A * | 10/1998 | Maniar ....................... 438/782 |
| 5,928,790 A * | 7/1999 | Bokisa ........................ 428/416 |
| 6,043,330 A * | 3/2000 | Hacker et al. ................. 528/12 |
| 6,074,962 A * | 6/2000 | Sakamoto et al. ........... 438/790 |
| 6,140,445 A * | 10/2000 | Su et al. ........................ 528/15 |
| 6,342,097 B1 * | 1/2002 | Terry et al. ............. 106/287.13 |
| 6,348,269 B1 * | 2/2002 | Terry .......................... 428/447 |
| 6,410,151 B1 | 6/2002 | Kurosawa et al. |
| 6,413,446 B1 | 7/2002 | Mechtel et al. |
| 6,660,822 B2 | 12/2003 | Lyu et al. |
| 6,696,538 B2 | 2/2004 | Ko et al. |
| 2001/0051446 A1 * | 12/2001 | Inoue et al. .................. 438/780 |
| 2001/0053840 A1 * | 12/2001 | Ko et al. ........................ 528/36 |
| 2002/0076565 A1 * | 6/2002 | Fairbourn .................... 428/457 |
| 2003/0157344 A1 * | 8/2003 | Shoup et al. ................. 428/447 |
| 2003/0181537 A1 | 9/2003 | Kirchmeyer et al. |

FOREIGN PATENT DOCUMENTS

| | | |
|---|---|---|
| JP | 63-43973 | 2/1988 |
| JP | 07-333208 A | 12/1995 |
| JP | 11-244676 A | 9/1999 |
| JP | 2001-172573 A2 | 6/2001 |

\* cited by examiner

*Primary Examiner*—Randy Gulakowski
*Assistant Examiner*—Robert Loewe
(74) *Attorney, Agent, or Firm*—McKenna Long & Aldridge LLP

(57) ABSTRACT

The present invention relates to low a dielectric material essential for a next generation semiconductor with high density and high performance, and more particularly to a low dielectric material that is thermally stable and has good film-forming properties and excellent mechanical properties, a dielectric film comprising the low dielectric material, and a semiconductor device manufactured using the dielectric film. The present invention also provides an organic silicate polymer having a flexible organic bridge unit in the network prepared by the resin composition of the component (a) and the component (b), wherein component (a) is an organosilane of the formula $R^1_m R^2_n SiX_{4-m-n}$ (where each of $R^1$ and $R^2$ which may be the same or different, is a non-hydrolysable group; X is a hydrolysable group; and m and n are integers of from 0 to 3 satisfying $0 \leq m+n \leq 3$) and/or a partially hydrolyzed condensate thereof and wherein component (b) is an organic bridged silane of the formula $R^3_p Y_{3-p} Si\text{-}M\text{-}SiR^4_q Z_{3-q}$ (where each of $R^3$ and $R^4$ which may be the same or different, is a non-hydrolysable group; each of Y and Z which may be the same or different, is a hydrolysable group; and p and q are integers of from 0 to 2) and/or a cyclic oligomer with organic bridge unit (Si-M-Si).

8 Claims, No Drawings

SEMICONDUCTOR INTERLAYER DIELECTRIC MATERIAL AND A SEMICONDUCTOR DEVICE USING THE SAME

RELATED APPLICATIONS

This application is a continuation of U.S. application Ser. No. 10/652,918, filed on Aug. 28, 2003, now abandoned, which is continuation-in-part of U.S. application Ser. No. 09/776,383, filed on Feb. 2, 2001, now U.S. Pat. No. 6,696,538, which claims the benefit of U.S. Provisional Application No. 60/179,653, filed Feb. 2, 2000.

FIELD OF THE INVENTION

The present invention relates to a low dielectric material essential for a next generation semiconductor device with high density and high performance, and more particularly to a low dielectric material that is thermally stable and has good film-forming properties and excellent mechanical properties, a dielectric film comprising the same, and a semiconductor device manufactured from the dielectric film.

BACKGROUND OF THE INVENTION

The semiconductor industry is moving toward increasing device complexity, requiring shrinking geometric dimensions and higher component integration with greater dimensional densities in integrated circuit devices, e.g. memory and logic chips. This has led to an increase in the number of wiring levels and a reduction in the wiring pitch to increase the wiring density. Current leading-edge logic processors have 6-7 levels of high density interconnect, and interconnect line width is scheduled to decrease to 0.1 μm around the year 2005.

As device dimensions shrink to less than 0.25 μm, the propagation delay, crosstalk noise, and power dissipation due to resistance-capacitance (RC) coupling become significant. The smaller line dimension increases the resistivity of metal wires, and the narrow intermetal spacing increases the capacitance between the metal wires. Thus although the speed of the device will increase as the feature size decreases, the interconnect delay becomes the major fraction of the total delay and limits the overall chip performance. Accordingly, in order to prepare a chip having high speed, a conductor having a low resistance and a dielectric material having low dielectric constant should be used. In addition, the use of low dielectric material can remarkably decrease the power dissipation and crosstalk noise.

Recently, several semiconductor device manufacturers have put test products on the market that show improvement in their performance of 20% or more, using copper wiring with high electric conductivity instead of using the conventional aluminum wiring. Recently they shift to use of new materials that exhibit low dielectric constant performance, for use in interconnects. If the dielectric films between interconnect layers in integrated circuit can make use of these materials, the effect on operating speed will be the same as that which resulted with the switch from aluminum to copper technology. For instance, if the dielectric constant of the dielectric material is changed from 4.0 to about 2.5, IC operating speed will be improved by about 20%.

The interlayer dielectric material used in semiconductor integrated circuit devices is predominantly $SiO_2$, which is generally formed using chemical vapor deposition (CVD) or plasma enhanced techniques and has the requisite mechanical and thermal properties to withstand various processing operations associated with semiconductor manufacturing. The relative dielectric constant of a $SiO_2$ material varies with the conditions under which a dielectric is formed; that of silicon thermal oxidation films, which have the lowest dielectric constant, is on the order of 4.0. Attempts have been made to reduce the dielectric constant by introducing fluorine atoms into an inorganic film deposited by CVD. However, the introduction of fluorine atoms in large amounts decreases the chemical and thermal stability, so the dielectric constant achieved in actual practice is on the order of 3.5. Fluorinated oxides can provide an immediate near-term solution and a shift to new types of insulating materials with sub-3 dielectric constant may be required.

One class of candidates is organic polymers, some of which have a dielectric constant of less than 3.0. Incorporating fluorine into such organic polymer is known to further lower the dielectric constant. Most organic polymers do not, however, possess the physico-chemical properties required for on-chip semiconductor insulation, particularly thermal stability and mechanical properties (sufficient to withstand back end of the line fabrication temperatures within the range of 400~450° C.). Few organic polymers are stable at temperatures greater than 450° C. They also have a low glass transition temperature and thus elasticity thereof remarkably decreases at high temperature, and they have a very high linear expansion coefficient. Since temperature rises to up to 450° C. during semiconductor IC integration and packaging processes, the resulting low thermal stability and elasticity and high linear expansion coefficient can deteriorate the reliability of the device.

Recently in order to solve thermal stability problems of organic polymers, the development of organic silicate polymers using a sol-gel process has emerged. In particular, organic SOG (Spin On Glass) has been proposed for use as interlayer dielectrics in which the side chain of an organic component (an alkyl group such as methyl) is bonded to the backbone chain of a siloxane bond. While having a lower dielectric constant, e.g., the range of about 2.7~3.2, than conventional glasses, such materials typically have poor mechanical properties. For instance, methylsilsesquioxnane polymer experiences crack formation during processing unless the film is very thin (often <1 μm).

Miller et al. have reported a method of toughening the silsesquioxane material systems by incorporating a small amount of polymeric substituents such as a polyimide. A method of mixing an inorganic fine particulate powder is also known as another method for improving the mechanical properties of organosilicates. Although various systems have been proposed, there remains a need for a material having a suitable low dielectric constant and appropriate physico-chemical properties for use as an interlayer dielectric in the future generation of IC devices.

SUMMARY OF THE INVENTION

The present invention is made in consideration of the problems of the prior art, and it is an object of the present invention to provide a dielectric material that can make the speed of a semiconductor device high, decrease power consumption thereof, and reduce crosstalk between metal wiring.

It is another object of the present invention to provide an organic silicate polymer having improved crack resistance and mechanical strength, a dielectric film prepared using the organic silicate polymer, a semiconductor device comprising the dielectric film, and processes for preparing them.

In order to achieve these objects, the present invention provides an organic silicate polymer for an interlayer insulating film for a semiconductor device, which has a carbon bridge unit in the network and is prepared by a cross-linking reaction between the following component (a) and (b):

(a) organosilane of the formula $R^1_m R^2_n SiX_{4-m-n}$ (where each of $R^1$ and $R^2$ which may be the same or different, is a non-hydrolysable group selected from hydrogen, alkyl, fluorine-containing alkyl or aryl group; X is a hydrolysable group selected from halide, alkoxy or acyloxy, and m and n are integers of from 0 to 3 satisfying $0 \leq m+n \leq 3$), or a partially hydrolyzed condensate thereof; and (b) organic bridged silane of the formula $R^3_p Y_{3-p}$-Si-M-$SiR^4_q Z_{3-q}$ (where each of $R^1$ and $R^4$ which may be the same or different, is non-hydrolysable group selected from hydrogen, alkyl, fluorine-containing alkyl, alkenyl, or aryl; each of Y and Z which may be the same or different, is a hydrolysable group selected from halide, alkoxy or acyloxy; M is alkylene group having carbon atoms of 2 to 3; and p and q are integers of from 0 to 2).

In addition, the present invention provides an organic silicate polymer for an interlayer insulating film for a semiconductor device, which has a carbon bridge unit in the network and is prepared by a cross-linking reaction between the following component (a) and (b):

(a) organosilane of the formula $R^1_m R^2_n SiX_{4-m-n}$, (where each of $R^1$ and $R^2$ which may be the same or different, is a non-hydrolysable group selected from hydrogen, alkyl, fluorine-containing alkyl or aryl group; X is a hydrolysable group selected from halide, alkoxy or acyloxy; and m and n are integers of from 0 to 3 satisfying $0 \leq m+n \leq 3$), or a partially hydrolyzed condensate thereof; and (b) a cyclic silane oligomer with carbon bridge unit (Si-M-Si) (wherein, M is alkylene group having carbon atoms of 2 to 3).

Accordingly, in a first embodiment, an organic silicate polymer for an interlayer insulating film for a semiconductor device is provided, wherein the organic silicate polymer includes a carbon bridge unit in a network and is prepared by a cross-linking reaction between a component (a) and a component (b), wherein: component (a) includes an organosilane of the formula $R^1_m R^2_n SiX_{4-m-n}$ wherein each of $R^1$ and $R^2$ which may be the same or different, is a non-hydrolysable group selected from the group consisting of hydrogen, alkyl, fluorine-containing alkyl, and aryl; X includes a hydrolysable group selected from the group consisting of halide, alkoxy, and acyloxy; and m and n are integers of from 0 to 3 satisfying $0 \leq m+n \leq 3$, or a partially hydrolyzed condensate thereof; and component (b) includes an organic bridged silane of the formula $R^3_p Y_{3-p}$-Si-M-$SiR^4_q Z_{3-q}$ wherein each of $R^1$ and $R^4$ which may be the same or different, includes a non-hydrolysable group selected from the group consisting of hydrogen, alkyl, fluorine-containing alkyl, alkenyl, and aryl; each of Y and Z which may be the same or different, includes a hydrolysable group selected from the group consisting of halide, alkoxy, and acyloxy; M includes an alkylene group including from 2 to 3 carbon atoms; and p and q are integers of from 0 to 2.

In an aspect of the first embodiment, M includes an ethylene group.

In an aspect of the first embodiment, the organic bridged silane is synthesized by reacting a silane monomer containing a Si—H with a silane monomer containing an aliphatic unsaturated hydrocarbon carbon group of formula —CH=$CH_2$ in the presence of a catalyst.

In an aspect of the first embodiment, the organic silicate polymer has a weight average molecular weight of from 500 to 100,000.

In an aspect of the first embodiment, the partially hydrolyzed condensate of the organosilane is obtained by a reaction of the organosilane in an organic solvent after addition of water and a catalyst.

In an aspect of the first embodiment, more than 5 parts by weight of the component (b) is present per 100 parts by weight of the component (a).

In a second embodiment, an organic silicate polymer for an interlayer insulating film for a semiconductor device is provided, which has a carbon bridge unit in the network and is prepared by a cross-linking reaction between component (a) and component (b), wherein: component (a) includes an organosilane of the formula $R^1_m R^2_n SiX_{4-m-n}$ wherein each of $R^1$ and $R^2$ which may be the same or different, includes a non-hydrolysable group selected from the group consisting of hydrogen, alkyl, fluorine-containing alkyl, and aryl group; X includes a hydrolysable group selected from the group consisting of halide, alkoxy, and acyloxy; and m and n are integers of from 0 to 3 satisfying $0 \leq m+n \leq 3$, or a partially hydrolyzed condensate thereof; and component (b) includes a cyclic silane oligomer with carbon bridge unit (Si-M-Si) (wherein, M is alkylene group having carbon atoms of 2 to 3).

In an aspect of the second embodiment, M includes an ethylene group.

In an aspect of the second embodiment, the cyclic silane oligomer with carbon bridge unit (Si-M-Si) is synthesized by reacting a silane monomer containing a Si—H with a silane monomer containing aliphatic unsaturated hydrocarbon group of formula —CH=$CH_2$ in the presence of a catalyst.

In an aspect of the second embodiment, the cyclic silane oligomer with carbon bridge unit (Si-M-Si) is synthesized by a hydrosilyation reaction of one or more oligomers of ring structure (I):

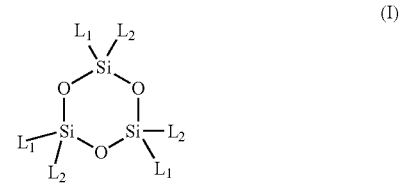

(I)

wherein $L_1$ includes an alkenyl group including 2 to three carbon atoms, and $L_2$ is selected from the group consisting of hydrogen, alkyl, and aryl.

In an aspect of the second embodiment, the cyclic silane oligomer with carbon bridge unit (Si-M-Si) is synthesized by a hydrosilyation reaction of one or more oligomers of ring structure (II):

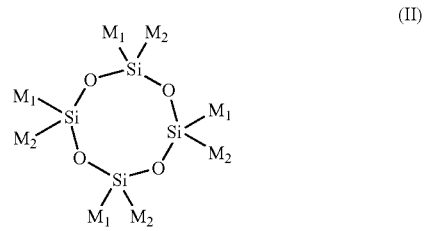

(II)

wherein $M_1$ includes an alkenyl group including two to three carbon atoms, and $M_2$ is selected from the group consisting of hydrogen, alkyl, and aryl.

In an aspect of the second embodiment, the cyclic silane oligomer with carbon bridge unit (Si-M-Si) is synthesized by a hydrosilyation reaction of an oligomer of ring structure (I) and an oligomer of ring structure (II):

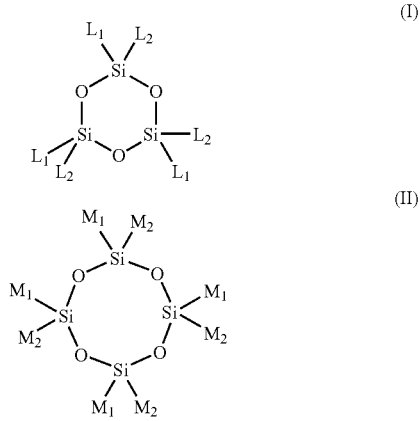

wherein $L_1$ includes an alkenyl group including two to three carbon atoms; $L_2$ is selected from the group consisting of hydrogen, alkyl, and aryl; $M_1$ includes an alkenyl group including two to three carbon atoms or an or allyl group including two to three carbon atoms; and $M_2$ is selected from the group consisting of hydrogen, alkyl, and aryl.

In an aspect of the second embodiment, the organic silicate polymer has a weight average molecular weight of from 500 to 100,000.

In an aspect of the second embodiment, more than 5 parts by weight of the component (b) is present per 100 parts by weight of the component (a).

In a third embodiment, an interlayer dielectric film for a semiconductor device is provided including the organic silicate polymer of the first embodiment.

In a fourth embodiment, a semiconductor device including the interlayer dielectric film of the third embodiment is provided.

In a fifth embodiment, a process for preparing an interlayer dielectric film for a semiconductor device is provided, the process including the steps of: a) dissolving the organic silicate polymer of claim 1 in a solvent, whereby a dissolved solution is obtained; b) spin coating the dissolved solution obtained in step a) on a substrate to form a coating film; c) drying the coating film obtained in step b) to obtain a dried film; and d) curing the dried film obtained in step c) at a temperature of 300 to 500° C.

In a sixth embodiment, a semiconductor device including the interlayer dielectric film prepared according to the fifth embodiment is provided.

DETAILED DESCRIPTION OF THE PREFERRED EMBODIMENT

The present invention provides a low dielectric resin composition useful as e.g. a resin composition capable of forming a uniform dielectric film by overcoming a drawback such that it is mechanically brittle, while maintaining mechanical hardness and excellent electrical properties of a resin having a low dielectric constant.

The present invention provides a low dielectric resin composition comprising the following components (a) and (b), and a process for its production. A dielectric film formed by the resin composition of the present invention is a film having a dielectric constant at most 3.3, preferably less than 3.0, wherein a cured product prepared by the component (a) and component (b) are uniformly cross-linked by a chemical reaction:

(a) organosilane of the formula $R^1{}_m R^2{}_n SiX_{4-m-n}$ (where each of $R^1$ and $R^2$ which may be the same or different, is a non-hydrolysable group; X is a hydrolysable group; and m and n are integers of from 0 to 3 satisfying $0 \leq m+n \leq 3$) and/or a partially hydrolyzed condensate thereof (b) organic bridged silane of the formula $R^3{}_p Y_{3-p} Si\text{-}M\text{-}SiR^4{}_q Z_{3-q}$ (where each of $R^3$ and $R^4$ which may be the same or different, is a non-hydrolysable group; each of Y and Z which may be the same or different, is an hydrolysable group; M is alkylene group having carbon atoms of 2 to 3; and p and q are integers of from 0 to 2) and/or a cyclic silane oligomer with organic bridge unit (Si-M-Si).

Since the resin composition of the present invention comprises the (a) organosilane and the (b) organic bridged silane, it has remarkably improved crack resistance and mechanical properties, compared to those consisting only of the (a) organosilane.

As the component (a) organosilane of the formula $R^1{}_m R^2{}_n SiX_{4-m-n}$, each of $R^1$ and $R^2$ is independently hydrogen, alkyl such as methyl, ethyl or others, fluorine-containing alkyl group such as trifluoromethyl or trifluoropropyl, or aryl such as phenyl, X is independently hydrolysable group, halide such as chlorine, alkoxy such as methoxy, ethoxy or propoxy, acyloxy such as acetoxy, or others. Some examples of the component (a) organosilane include tetraalkoxysilane, mono- alkyltrialkoxysilane, dialkylalkoxysilane, tetrachlorosilane, monoalkyltrichlorosilane, dialkyldichlorosilane, a mixture thereof etc. The partially hydrolyzed product of the organosilane monomer can be obtained by allowing a monomer or an oligomer to react in an organic solvent after addition of water and a catalyst at a temperature not higher than the boiling point of the organic solvent for a state time.

As the component (b) organic bridged silane of the formula $R^3{}_p Y_{3-p} Si\text{-}M\text{-}SiR^4{}_q Z_{3-q}$, each of $R^3$ and $R^4$ is independently- hydrogen, alkyl, such as methyl, ethyl or others, fluorine-containing alkyl group such as trifluoromethyl or trifluoropropyl, alkenyl such as vinyl or allyl, or aryl such as phenyl, Y and Z are independently hydrolysable group, halide such as chlorine, alkoxy such as methoxy, ethoxy or propoxy, acyloxy such as acetoxy, or others. When $R^3$ and/or $R^4$ are alkenyl, it may be further bridged by a method of hydrosilylation reaction described below. Organic bridge unit, M, is alkylene group having carbon atoms of 2 to 3, more preferably ethylene. If an alkylene group having carbon atom of 1 is used, crack resistance of the prepared resin will be deteriorated, and if one having carbon atoms more than 3 is used, mechanical strength will be deteriorated.

Synthesis of the organic bridged silane is afforded from hydrosilylation reaction, i.e. an addition reaction between a silane monomer containing a Si—H group with a silane monomer containing aliphatic unsaturated carbon ($-CH=CH_2$) in presence of a catalyst or free radical initiator. Preferred catalysts in the present invention are the platinum group metal containing catalysts. They can be any of those known in the art to effect a hydrosilylation reaction between a silicon-bonded hydrogen atom and an unsaturated carbon-carbon bond, e.g. platinum, palladium, osmium, iridium, and ruthenium etc. A transition metal catalyst such as platinum, or a free radical initiator is employed in an effective amount, depending on the particular catalyst used.

Cyclic oligomer with organic bridge (Si-M-Si) unit can be synthesized by the hydrosilylation reaction of a oligomer of ring structure (I) and/or ring structure (II), i.e. an addition reaction between a silane monomer containing a Si—H. group with a cyclic oligomer (I) and/or (II) containing aliphatic unsaturated carbon (—CH=CH$_2$) in presence of a catalyst or free radical initiator,

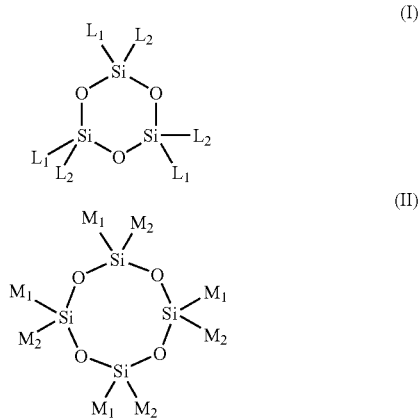

where $L_1$ is alkenyl having carbon atoms of 2 to 3, and $L_2$ is hydrogen, alkyl such as methyl, ethyl or others, or aryl such as phenyl; and, $M_1$ is alkenyl having carbon atoms of 2 to 3, and $M_2$ is hydrogen, alkyl such as methyl, ethyl or others, or aryl such as phenyl.

The cross-linking reaction between the component (a) and the component (b) may take place in the state of the solution or during the state of forming the coating film. However, it is preferred that the crosslinking reactions partially take place in the state of the solution to form a uniformly distributed random copolymer. The partially hydrolyzed copolymer product can be obtained by allowing a component (a) and a component (b) to react in an organic solvent after addition of water and catalyst.

The compositional proportion of the resin (b) can be set at optional levels depending upon the particular purpose. Usually it is preferred to mix the organic bridged silane (b) in an amount of more than 5 parts by weight, preferably more than 10 parts, per 100 parts by weight of the resin (a). If the proportion of the organic bridged silane content is too small, the mechanical properties may not be adequately improved.

Solvents which may be used include any agent or mixture of agents which will dissolve the composition to form a homogeneous liquid mixture of component (a) and (b). These solvents include alcohols such as methyl alcohol, ethyl alcohol or isopropyl alcohol, aromatic hydrocarbon such as benzene or toluene, ketones such as acetyl acetone, methyl isobutyl ketone or methyl ethyl ketone, ethers or esters, and others.

As the catalyst, an acid or a base may be used. The acid catalyst is not specifically limited, and may include hydrochloric acid, sulfuric acid, phosphoric acid, nitric acid, formic acid, propionic acid, butyric acid, oxalic acid or acetic acid, succinic acid, or others. The base catalyst is not specifically limited, and may include ammonia, organic amine, sodium hydroxide, potassium hydroxide, or others.

There are no particular limitations on the reaction temperature when the product is made to have a high molecular weight.

There are no particular limitations on the reaction time at the time of hydrolysis, and the reaction may be completed at the time the product reaches a stated molecular weight. It is usually preferred to set the molecular weight of the product within a range of from 500 to 100,000 as a weight average molecular weight. If the molecular weight of a hydrolyzed co-condensate of the component (a) and (b) is less than 500, it may be difficult to form a uniform coating film, and if the molecular weight of a hydrolyzed co-condensate is greater than 100,000, co-condensate polymer may become insoluble. The solid content concentration in the solution, as the sum of the resin component (a) and resin component (b), may suitable be selected from the viewpoint of the desired viscosity of the solution or the film thickness of the coating film, within the range where the solid content dissolves.

As a method for forming a coating film on a substrate, it is preferred to employ a method wherein the composition of the present invention containing a solvent is coated on the substrate, followed by heating and drying to evaporated solvent. Here the resin composition is applied to a substrate by methods known in the art such as spin coating, dip coating, spray coating, flow coating, screen-printing or others. The coating method may suitably be selected depending on the shape of the substrate to be coated, the required film thickness, etc. When the composition of the present invention is to be applied to an interlayer dielectric film for a semiconductor device, a spin coating method is preferred, since the in-plane distribution of the film thickness will thereby be uniform. The solid content concentration in the solution, as the sum of the resin composition of (a) and (b) may suitably be selected from the viewpoint of the desired viscosity of the solution or the thickness of the coating film, within the range where the solid content dissolves.

To form a coating film, a curing step is required after coating, to evaporate the solvent and further to crosslink the partially hydrolyzed co-condensate of mixture of the resin component (a) and (b). The heating may be conducted as a single-step process or a step-wise process. For a sufficient cure the partially hydrolyzed co-condensate of the mixture of resin composition (a) and (b) and to ensure that unreacted alkoxysilyl groups or silanol groups will not remain, a final curing at temperature of preferably from 300 to 500° C., more preferably for 400 to 500° C., is required. Unreacted alkoxysilyl groups or silanol groups will be a factor for increasing the dielectric constant of the coating film by themselves, and they may further be a water-absorbing site, which causes an increase of the dielectric constant by water. Accordingly, it is desirable not to let them remain in the coating film.

The coating produced by the method herein are on any substrate such as a metal or a ceramic but particularly useful on an electronic substrates intended for use in manufacture of an electronic device; an integrated circuit (IC) device, such as memory IC, logic IC or MMIC (monolithic microwave IC); a hybrid IC; a optical device, such as a light emitting diode or a charge coupled device; display device such as a liquid crystal display device and the like.

The coating film formed by the composition of the present invention is applied as a buffer coating film, a passivation film, or an interlayer dielectric film for a electronic device, whereby it is possible to attain high performance in e.g. reducing the time of signal propagation delay of a device by virtue of excellent electrical properties such as a low dielectric constant and a high dielectric strength, and it is also possible to attain high reliability by virtue of excellent mechanical properties. The resin composition of the present invention may be useful as a matrix resin composition for preparing porous dielectric films. For instance a mixture of the resin composition of the present invention and thermally labile polymers or organic small molecules may be spin-coated and thermally cured to initiate vitrification and decomposition of the labile polymers or small molecules.

Now, the following examples are provided to illustrate the present invention. The detailed preparations fall within the scope of, and serve to exemplify, the more generally described methods set forth above. These examples are presented for illustrative purposes only, and should not used to limit the scope of this invention found in the claims.

EXAMPLE 1

10 µl of 0.1 M platinum catalyst and 1.74 ml of vinyltrimethoxysilane were mixed and reacted in a completely dried reaction container at room temperature for approximately 15 minutes, and then 2.3 ml of trimethoxysilane was introduced therein and reaction was continued at 50° C. for 15 hours under a nitrogen atmosphere. Remaining reactants were completely removed under vacuum, and the completion of the hydrosilylation reaction was confirmed with a NMR spectrum.

6 ml of methyltrimethoxysilane and 1.06 ml of the hydrosilylation reaction product (bistrimethoxysilylethane) were mixed in another container with 15 ml of tetrahydrofuran solvent, and the temperature thereof was lowered to 5° C. under a nitrogen atmosphere. To the mixed solution, 0.7 ml of 0.2 N hydrochloric acid diluted with 7.47 ml of distilled water were slowly added thereto while stirring. After reaction at 70° C. for overnight, the solution was cooled to room temperature, and then it was diluted with toluene and washed with distilled water until the pH thereof became neutral. Magnesium sulfate was introduced into the obtained organic layer to completely remove remaining water therein, and the organic solvent was completely removed from the obtained organic layer in a vacuum oven.

300 mg of the obtained powder was dissolved in methylisobutylketone such that the total solution amounted to 1.5 g. The obtained solution was filtered to remove impurities therefrom, spin-coated to obtain a thin film, and cured under a nitrogen atmosphere at 430° C. for 1 hour to prepare a dielectric film.

EXAMPLE 2

10 µl of 0.1 M platinum catalyst and 1.0 ml of 2,4,6,8-tetravinyl-2,4,6,8-tetramethyl siloxane were mixed and reacted in a completely dried reaction container at a room temperature for approximately 15 minutes, and then 3.15 ml of triethoxysilane were introduced therein and reaction was continued at 50° C. for 15 hours under a nitrogen atmosphere. Remaining reactants were completely removed under vacuum, and the completion of the reaction was confirmed with a NMR spectrum.

40 ml of tetrahydrofuran and 19 ml of methyltrimethoxy silane were mixed in another container and the temperature thereof was lowered to 5° C. under a nitrogen atmosphere. To the mixture solution, 20.83 ml of distilled water and 2.1 ml of 0.2 N hydrochloric acid were slowly added thereto while stirring. Then, the 2.1 ml of the hydrodsilylation product was again slowly added. After reaction at 70° C. for overnight, the solution was cooled to room temperature, and then it was diluted with toluene and washed with water until the pH became neutral. Magnesium sulfate was introduced into the obtained organic layer to completely remove remaining water therein, and the organic solvent was completely removed from the obtained organic layer in a vacuum oven.

The obtained powder was dried and cured to prepare a dielectric film by the same method as in Example 1.

COMPARATIVE EXAMPLE 1

7.6 ml of methytrimethoxysilane, 7.83 ml of distilled water and 10 ml of tetrahydrofuran were mixed at room temperature, and then 0.8 ml of 0.2 N hydrochloric acid was slowly added to the mixture while stirring. After reaction at 70° C. for overnight, the solution was cooled to room temperature, and then it was diluted with toluene and washed with water until the pH became neutral. Magnesium sulfate was introduced into the obtained organic layer to completely remove remaining water therein, and the organic solvent was completely removed from the obtained organic layer in a vacuum oven.

The obtained powder was dried and cured to prepare a dielectric film by the same method as in Example 1.

Fracture properties of the films were measured using a microvicker indenter, which can produce small cracks emanating from the indentation corners. Mechanical Young's Modulus was measured using a nanoindenter (TriboIndenter from Hysitron Inc.). The results are shown in the following Table 1.

TABLE 1

|  | Example 1 | Example 2 | Comparative Example 1 |
| --- | --- | --- | --- |
| Modulus/Hardness | 7.1/1.0 | 6.1/0.9 | 3.4/0.6 |
| Crack velocity | $1.1 \times 10^{-11}$ m/s | $7 \times 10^{-11}$ m/s | $6.0 \times 10^{-9}$ |

EXAMPLE 3

An organic polysiloxane was prepared by the same method as in Example 1, except that 5 ml of methyltrimethoxysilane and 2.21 ml of bistrimethoxysilyethane were used. A dielectric film was prepared therefrom by the same method as in Example 1.

COMPARATIVE EXAMPLE 2

An organic polysiloxane was prepared by the same method as in Comparative Example 1, except that 5.43 ml of methyltrimethoxysilane and 2.25 ml of tetramethoxysilane were used instead of 7.6 ml of methyltrimethoxysilane. And, a dielectric film was prepared therefrom by the same method as in Example 1.

Measurement of Mechanical Properties

Dielectric constant: MIS (metal/insulator/semiconductor) device was manufactured on a Si wafer using each of the dielectric films. Then, dielectric constant was measured using LCR meter from HP Company at 1 Mhz.

Mechanical properties: The dielectric films of were respectively spin coated on Si wafer of 2×2 inches, and then they were cured under N2 conditions at 430° C. for 1 hour. Then, mechanical properties were measured.

Crack resistance: Scratch tests were conducted on the films with constant load in a horizontal direction, and the load applied when crack is generated was considered as a critical load. Spherical tip with a length of 1 µm having inside angle of 90° was used. For scratch test, critical load was measured under the conditions of film thickness of about 550 nm, scratch speed of 0.2 µm/sec, and loading rate of 100 µN/sec.

Mechanical strength and scratch test were conducted using TriboIndenter from Hysitron Inc.

The results are shown in the following Table 2, wherein MTMS is methyltrimethoxysilane and BTMSE is bistrimethoxysilyethane.

TABLE 2

|  | Example 3 | Comparative Example 2 |
|---|---|---|
| Composition | MTMS:BTMSE = 100:25 | MTMS:TMOS = 100:40 |
| Dielectric constant (k) | 2.93 | 2.91 |
| Modulus/Hardness (GPa) | 9.1/1.3 | 9.3/1.3 |
| Critical Load (mN) | 3.75 | 2.91 |

As can be seen from the above Table 2, although the siloxane resin of Comparative Example 2 which does not contain carbon bridges shows good dielectric property and mechanical strength, crack resistance is remarkably inferior to the siloxane resin of Example 3 which contains carbon bridges.

EXAMPLES 4 TO 7 AND COMPARATIVE EXAMPLES 3 to 7

Organic polysiloxanes were prepared by the same method as in Example 1 with the compositions compositional ratios shown in the Tables 2 and 3. Dielectric films were prepared therefrom by the same method as in Example 1. Mechanical properties were measured as described above, and the results were shown in the Tables 3 and 4, wherein MTMS is methyltrimethoxysilane, BTMSE is bistrimethoxysilylethane, BTMSP is bistrimethoxysilylpropane, BTMSM is bistrimethoxysilylmethane, and BTMSH is bistrimethoxysilylhexane.

TABLE 3

|  | Example 4 | Example 5 | Comparative Example 3 | Comparative Example 4 |
|---|---|---|---|---|
| composition | MTMS:BTMSE (C = 2) 100:11 (mole ratio) | MTMS:BTMSP (C = 3) 100:11 (mole ratio) | MTMS:BTMSM (C = 1) 100:11 | MTMS:BTMSH (C = 6) 100:11 |
| Dielectric constant (k) | 2.76 | 2.73 | 2.78 | 2.72 |
| Modulus/Hardness (GPa) | 7.1/1.0 | 6.4/1.0 | 6.8/0.9 | 3.8/0.6 |
| Critical Load (mN) | 3.59 | 3.51 | 2.32 | 4.14 |

TABLE 4

|  | Example 6 | Example 7 | Comparative Example 5 | Comparative Example 6 | Comparative Example 7 |
|---|---|---|---|---|---|
| Composition | MTMS: BTMSE (C = 2) 100:5 | MTMS: BTMSE (C = 2) 100:25 | MTMS: BTMSH (C = 6) 100:5 | MTMS: BTMSH (C = 6) 100:18 | MTMS: BTMSH (C = 6) 100:25 |
| E/H (GPa) | 5.4/0.8 | 9.1/1.3 | 4.8/0.7 | 3.8/0.5 | 3.7/0.5 |

Tables 3 and 4 show mechanical properties according to the kinds of carbon bridge units. As can be seen from Table 2, in case a carbon bridge unit is methane (C=1), mechanical strength property is similar or a little inferior, but crack resistance is remarkably inferior compared to ethane (C=2). And, in case a carbon bridge unit is hexane (C=6), crack resistance is improved but mechanical strength is remarkably inferior. In addition, as can be seen from Table 4, in case a carbon bridge unit is ethane, crack resistance and mechanical strength increase as the content increases, but in the case of hexane, crack resistance and mechanical strength decrease as the content increase. Accordingly, it can be confirmed that carbon bridge unit has suitably has carbon atoms of 2 to 3 in terms of mechanical strength and crack resistance, and more preferably has carbon atoms of 2.

COMPARATIVE EXAMPLE 8

An organic polysiloxane was prepared by the same method as in Example 1, except that only 6.36 ml of bistrimethoxysilylethane was used. A film was prepared therefrom by the same method as in Example 1. Dielectric constant of the prepared film was measured to be 3.87, which is very high. Therefore, it can be seen that in case a film was prepared using a siloxane polymer consisting only of organic bridge silane compounds, it has very high dielectric constant hence is not suitable for a dielectric material.

The present invention solves the defects of the prior art that conventional organic silicate film has low crack resistance and mechanical strength, by preparing an organic silicate polymer having a flexible organic bridge unit in the network. Although this invention has been described with respect to specific embodiments, the details thereof are not be constructed as limitations for it will be apparent that various embodiments, changes, and modifications may be resorted to without departing from the spirit and scope thereof, and it is understood that such equivalent embodiments are intended to be included within the scope of this invention.

What is claimed is:

1. An interlayer dielectric film for a semiconductor device comprising an organic silicate polymer, wherein the organic silicate polymer comprises a carbon bridge unit in a network and is prepared by a cross-linking reaction between a mixture consisting of component (a) and component (b), wherein:

component (a) comprises an organosilane of the formula $R^1_m SiX_{4-m}$ wherein $R^1$ is a non-hydrolysable group selected from the group consisting of hydrogen, and alkyl; X comprises a hydrolysable group selected from the group consisting of halide, and alkoxy; and m is an integer of from 0 to 3, or a partially hydrolyzed condensate thereof; and component (b) comprises an organic bridged silane of the formula $R^3_p Y_{3-p} Si-M-SiR^4_q Z_{3-q}$ wherein each of $R^3$ and $R^4$ which may be the same or different, comprises a non-hydrolysable group selected from the group consisting of hydrogen, and alkyl; each of Y and Z which may be the same or different, comprises a hydrolysable group selected from the group consisting of halide, and alkoxy; M comprises an alkylene group comprising from one to three carbon atoms; and p and q are integers of from 0 to 1.

2. A semiconductor device comprising the interlayer dielectric film of claim 1.

3. A process for preparing the interlayer dielectric film of claim 1 comprising the steps of:
   a) dissolving the organic silicate polymer in a solvent, whereby a dissolved solution is obtained;
   b) spin coating the dissolved solution obtained in step a) on a substrate to form a coating film;
   c) drying the coating film obtained in step b) to obtain a dried film; and
   d) curing the dried film obtained in step c) at a temperature of 300 to 500° C.

4. The interlayer dielectric film according to claim 1, wherein M is an ethylene group.

5. The interlayer dielectric film according to claim 1, wherein the organic silicate polymer has a weight average molecular weight of from 500 to 100,000.

6. The interlayer dielectric film according to claim 1, wherein the partially hydrolyzed condensate of the organosilane is obtained by a reaction of the organosilane in an organic solvent after addition of water and a catalyst.

7. The interlayer dielectric film according to claim 1, wherein more than 5 parts by weight of the component (b) is present per 100 parts by weight of the component (a).

8. A process for preparing an interlayer dielectric film for a semiconductor device comprising the steps of:
   a) making an organic silicate polymer by a cross-linking reaction between a component (a) and a component (b), wherein component (a) is an organosilane of the formula $R^1_m SiX_{4-m}$ wherein $R^1$ is a non-hydrolysable group selected from the group consisting of hydrogen, and alkyl, X is a hydrolysable group selected from the group consisting of halide, and alkoxy, and m is an integer of from 0 to 3, or a partially hydrolyzed condensate thereof, and component (b) is an organic bridged silane of the formula $R^3_p Y_{3-p} Si\text{-}M\text{-}SiR^4_q Z_{3-q}$ wherein each of $R^3$ and $R^4$ is independently a non-hydrolysable group selected from the group consisting of hydrogen, and alkyl, each of Y and Z is independently a hydrolysable group selected from the group consisting of halide, and alkoxy; M comprises an alkylene group comprising from one to three carbon atoms; and p and q are integers of from 0 to 1;
   b) dissolving the organic silicate polymer in a solvent to obtain a solution;
   c) spin coating the solution obtained in step b) on a substrate to form a coating film;
   d) drying the coating film obtained in step c) to obtain a dried film; and
   e) curing the dried film obtained in step d) at a temperature of 300 to 500° C.

* * * * *